US009252778B2

(12) United States Patent
Tahiri et al.

(10) Patent No.: US 9,252,778 B2
(45) Date of Patent: Feb. 2, 2016

(54) ROBUST FLEXIBLE LOGIC UNIT

(71) Applicant: Scaleo Chip, Valbonne, Sophia Antipolis (FR)

(72) Inventors: Farid Tahiri, Le Cannet (FR); Pierre Dominique Xavier Garaccio, La Colle sur loup (FR)

(73) Assignee: Scaleo Chip, Valbonne, Sophia Antipolis (FR)

( * ) Notice: Subject to any disclaimer, the term of this patent is extended or adjusted under 35 U.S.C. 154(b) by 0 days.

(21) Appl. No.: 14/754,162

(22) Filed: Jun. 29, 2015

(65) Prior Publication Data

US 2015/0303926 A1    Oct. 22, 2015

Related U.S. Application Data

(63) Continuation-in-part of application No. 14/321,458, filed on Jul. 1, 2014, now Pat. No. 9,077,339, which is a continuation-in-part of application No. 14/153,760, filed on Jan. 13, 2014, now Pat. No. 9,048,827.

(60) Provisional application No. 62/000,156, filed on May 19, 2014, provisional application No. 61/883,443, filed on Sep. 27, 2013.

(51) Int. Cl.
H03K 19/177    (2006.01)

(52) U.S. Cl.
CPC .... *H03K 19/17752* (2013.01); *H03K 19/17704* (2013.01); *H03K 19/17756* (2013.01)

(58) Field of Classification Search
CPC .................. H03K 19/17704; H03K 19/17752
USPC ................................................ 326/37–41, 93
See application file for complete search history.

(56) References Cited

U.S. PATENT DOCUMENTS

| | | | |
|---|---|---|---|
| 6,191,613 B1 | 2/2001 | Schultz et al. | |
| 6,502,050 B1 | 12/2002 | Chan | |
| 6,675,306 B1 | 1/2004 | Baxter | |
| 6,766,505 B1 * | 7/2004 | Rangan | G06F 17/5054 326/39 |
| 6,825,690 B1 | 11/2004 | Kundu | |
| 6,981,167 B2 | 12/2005 | Johnson et al. | |
| 7,049,846 B1 | 5/2006 | Kundu | |
| 7,159,204 B2 | 1/2007 | Iotov et al. | |
| 7,203,842 B2 | 4/2007 | Kean | |
| 7,375,553 B1 | 5/2008 | Kundu | |
| 7,545,168 B2 | 6/2009 | Kundu | |
| 2003/0128050 A1 | 7/2003 | Schultz | |

(Continued)

Primary Examiner — Don Le
(74) Attorney, Agent, or Firm — Blakely Sokoloff Taylor & Zafman LLP

(57) ABSTRACT

A robust flexible logic unit (FLU) is targeted to be primarily, but not exclusively, used as an embedded field programmable gate array (EFPGA). The unit is comprised of a plurality of programmable building block tiles arranged in an array of columns and rows of tiles, and programmed tile by tile and column by column, using latches that are sequentially programmed and locked using a lock bit that is part of the bit stream provided. A scheme of odd and even clocks prevent latch transparency and ensures that loaded data is properly locked, to prevent overwrites. The robust FLU is further equipped with cyclic redundancy check capabilities to provide indication of faulty column configuration. The invention also provides for splitting the single FLU into multiple independent reconfigurable FLU sections, with independent user clock and reset, for implementing a plurality of independent functions or for establishing redundancy for critical functions.

19 Claims, 13 Drawing Sheets

(56) References Cited

U.S. PATENT DOCUMENTS

| | | |
|---|---|---|
| 2003/0212940 A1 | 11/2003 | Wong |
| 2004/0153923 A1* | 8/2004 | Goel .................. G06F 11/1402 714/724 |
| 2005/0040850 A1 | 2/2005 | Schultz et al. |
| 2005/0084076 A1 | 4/2005 | Dhir et al. |
| 2005/0097432 A1* | 5/2005 | Obuchi ............... H03M 13/091 714/800 |
| 2005/0121698 A1 | 6/2005 | Reynolds et al. |
| 2006/0006904 A1 | 1/2006 | Marui |
| 2007/0247189 A1 | 10/2007 | Phil et al. |
| 2012/0213268 A1 | 8/2012 | Liu et al. |
| 2014/0111247 A1 | 4/2014 | Hutton |

* cited by examiner

ROBUST FLEXIBLE LOGIC UNIT

CROSS-REFERENCE TO RELATED APPLICATIONS

This application is a continuation-in-part of U.S. patent application Ser. No. 14/321,458 filed Jul. 1, 2014, which claims the benefit pursuant to 35 U.S.C. 119(e) of U.S. Provisional Patent Application No. 62/000,156 filed May 19, 2014 and is a continuation-in-part of U.S. patent application Ser. No. 14/153,760 filed Jan. 13, 2014, which claims the benefit pursuant to 35 U.S.C. 119(e) of U.S. Provisional Patent Application No. 61/883,443 filed Sep. 27, 2013, each of which is hereby incorporated by reference in its entirety.

BACKGROUND OF THE INVENTION

1. Field of the Invention

The invention generally relates to field programmable gate arrays (FPGAs) and more particularly to the programming of FPGAs, and even more particularly with programming of embedded FPGAs (EFPGAs).

2. Prior Art

In today's world the use of integrated circuits (ICs) is ubiquitous, and they can be found in practically every device, even in the regular household. A particular branch of ICs is that of field programmable gate arrays (FPGAs) which are designed to be configured in the field, using some kind of a hardware description language (HDL). The language describes the specific configuration of components of the FPGA so that it is operated as desired by a user making use of the IC. One of the main advantages of FPGAs is the ability to perform partial or full reconfiguration of the device even when it is already connected as part of a system, if such capabilities are kept enabled for the device. In certain cases, reconfiguration takes place as part of the normal operation of the device as it may be necessary to perform different functions at different times.

In some cases FPGAs have therein embedded components such as microprocessors, and other peripheral devices to provide enhanced functionality. This integration leads to lower costs and reduced failures of the system. In other cases, certain ICs integrate therein features of FPGAs, creating embedded FPGAs (EFPGAs) to allow a certain degree of flexibility to a user to customize a component in a way that fits specific user design needs. Regardless of which FPGA is used, the challenge of the FPGA is in its programming that is a combination of a program and hardware support to allow the FPGA to be configured as desired. Such programming support in the prior art has a significant overhead associated thereto, which is a problem, especially in the case of EFPGAs where the overhead may become prohibitive for implementation or being cost effective. Implementations typically use D-type flip flops (DFFs) which require word lines and bit lines for a sequential approach, as well as row and column decoders.

Therefore, in view of the deficiencies of the prior art it would be advantageous to provide a solution for FPGAs in general, and EFPGAs in particular, that would reduce the overhead associated with the presence of programming support for the configurations of such FPGAs and EFPGAs.

BRIEF DESCRIPTION OF THE DRAWINGS

The subject matter that is regarded as the invention is particularly pointed out and distinctly claimed in the claims at the conclusion of the specification. The foregoing and other objects, features and advantages of the invention will be apparent from the following detailed description taken in conjunction with the accompanying drawings.

DETAILED DESCRIPTION OF THE PREFERRED EMBODIMENTS

Figure 1:
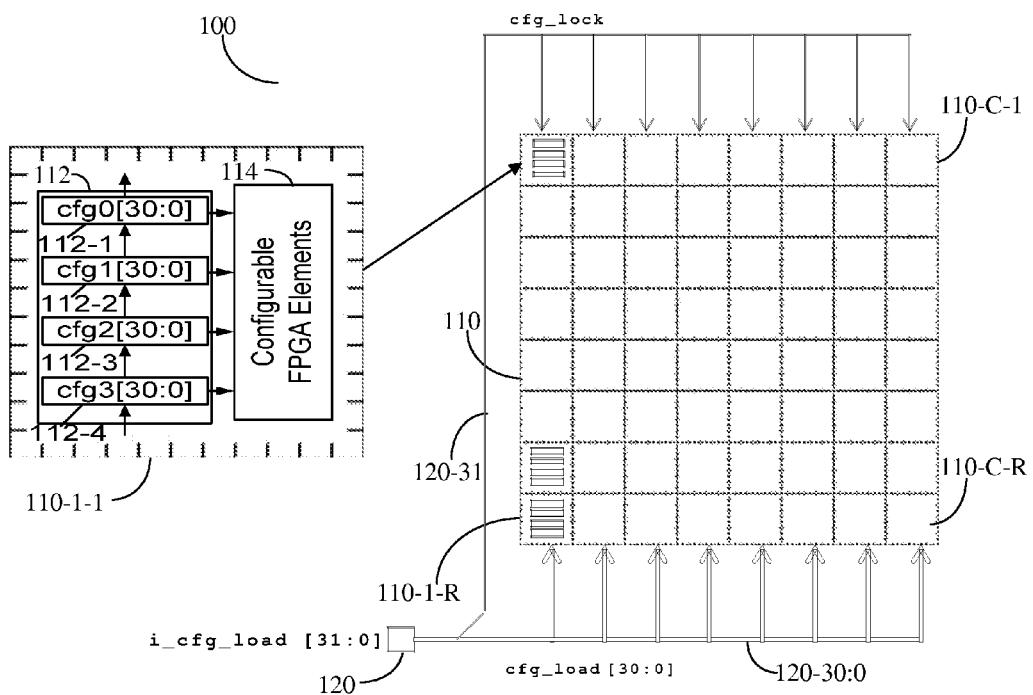
FIG. 1 is a block diagram of a tiled field programmable gate array (FPGA) of a flexible logic unit (FLU) having a configuration lock signal according to an embodiment.

It is important to note that the embodiments disclosed by the invention are only examples of the many advantageous uses of the innovative teachings herein. In general, statements made in the specification of the present application do not necessarily limit any of the various claims. Moreover, some statements may apply to some inventive features but not to others. In general, unless otherwise indicated, singular elements may be in plural and vice versa with no loss of generality. In the drawings, like numerals refer to like parts through several views.

A flexible logic unit (FLU) is targeted to be primarily, but not exclusively, used as an embedded field programmable gate array (EFPGA). The unit is comprised of a plurality of programmable building block tiles comprising configurable logic (e.g., 114 in FIG. 1) arranged in an array of columns and rows of tiles, and programmed by downloading configuration data, done tile by tile and column by column, using latches organized in latch banks (e.g., 112 in FIG. 1) that are sequentially programmed, each from the immediately previous latch. The latches are locked from being further written to using a lock bit, for example in the form of a flip flop (FF) as part of the configuration words provided. A scheme of odd and even clocks prevent latch transparency racing conditions and ensures that once configuration data has arrived at its destination it is properly locked, not to be unintentionally overwritten.

Therefore, according to the principles of the invention a FPGA is partitioned to multiple tiles, which may or may not be identical, containing elements that may be programmed with a configuration word. Instead of D-type flip flops (DFFs), i.e., devices that propagate an input D to its output Q on the edge of the clock, latches are organized in latch banks, where a latch propagates its input D to its output Q when the clock is, for example, at a logical high. This configuration allows for the relaxation of the clock skew constraints typically associated with the use of DFFs, and further provides for a smaller area of the latch in comparison to a DFF. However, the nature of a latch requires the use of a non-overlapping clock to avoid races, as well as a lock mechanism to ensure that once data has arrived at a latch, it remains there until the latch is unlocked. A latch bank may contain one or more latches. The use of latches further eliminates the need, according to an embodiment, for word lines and bit lines for the sequential approach and further eliminates the need for row and column decoders.

Reference is now made to FIG. 1 that shows an exemplary and non-limiting block diagram 100 of a tiled field programmable gate array (FPGA) 110 of a flexible logic unit (FLU) having a configuration lock signal 120-31 according to an embodiment. Each tile 110-c-r of the tiled FPGA 110, where 'c' is an integer having values from 1 to C and where 'r' is an integer having values from 1 to R, comprises one or more latch banks, for example latch banks 112-1 through 112-4, of latch bank element 112 as shown in the enlargement of tile 110-1-1. A latch bank may contain one or more latches, however the number of latches in a latch bank of any one of the latch bank elements 112 in a column has to be identical, i.e., 31 latches in latch bank 112-1 requires that all other latches in element 112 of 110-1-1 as well as any of the latch bank elements 112 of that particular column have the same number of latches in each latch bank. Control interface 120 receives, for example, a configuration word of 32 bits, of which 31 bits 120-30-0 are used to provide configuration data to the latches and one bit as a locking bit. As can be seen, the locking bits flow within a column 'c' in an opposite direction to that of the configuration data of the same column, according to an embodiment. Specifically, according to an embodiment, the tiles, each containing configurable FPGA elements 114 of the partitioned FPGA, are programmed within a column, tile by tile, and only once one column has been completely programmed, another column may be programmed. This simplifies the requirements on the programming overhead circuitry. It should be further noted that each column of tiles is programmed independently of any other column of tiles, that is, only the selected column for programming is programmed. Moreover, if a single latch bank is to be reprogrammed, it is necessary to program the entire column of latch banks of the column of tiles as no random access to any latch bank is provided according to the embodiments.

Figure 2:
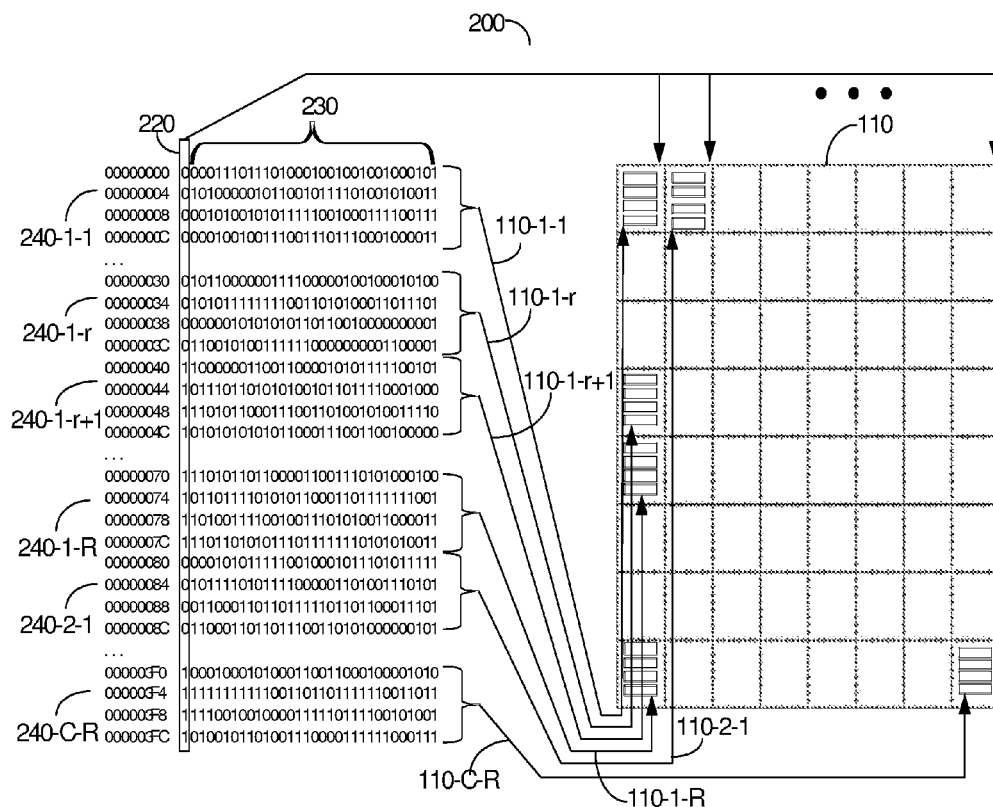
FIG. 2 is an illustrative diagram of the programming of the tiled FPGA having a configuration lock signal according to an embodiment.

FIG. 2 depicts an exemplary and non-limiting illustrative diagram 200 of the programming of the tiled FPGA 110 having a configuration lock signal according to an embodiment. The configuration data, shown on the left, may be stored, for example, in a memory, and is contained, merely for example purposes, in a 32-bit configuration word comprising 31 bits of configuration data and one lock bit. As noted with respect of FIG. 1, one column of bits, 220, is used for the lock signal purposes while the other bits 230 of the configuration word are used as configuration data to load a latch of a tile in a sequential order. Hence, configuration words 240-1-1 are used for the programming purposes of tile 110-1-1 (the first '–1' designating the column the tile is in and the second '–1' designating the row the tile is in); configuration words 240-1-r are used for the programming purposes of tile 110-1-r; configuration words 240-1-r+1 are used for the programming purposes of tile 110-1-r+1; configuration words 240-1-R is used for the programming purposes of tile 110-1-R, i.e., the last tile of the first column; configuration words 240-2-1 is used for the programming purposes of tile 110-2-1, i.e., the first tile of the second column; and, configuration words 240-C-R is used for the programming purposes of tile 110-C-R, i.e., the last tile of the last column. Furthermore, the flow of the lock bits 220 is opposite to that of the configuration words 240. It should be noted that the values of a lock bit in a particular configuration word is independent of the content of the particular configuration word and does not correspond thereto. It should be further noted that though the example shows that each tile has four latch banks in a tile, this should not be viewed as limiting on the invention. Each latch bank element 112 of a tile may have one or more latch banks therein, independent of the number of latch banks in any other tile of the column, as long as the number of latches in each of the latch banks is the same within a column of tiles. It should be noted that the lock bit needs to be changed from '0' to '1' when configuration data destined for the latch bank at the top of the column reaches its destination. From there on the lock bit data remains at a value of '1' until all configuration data is locked in its respective latch bank. Furthermore, as the clocks continue clocking the lock bits continue down the column until the final lock bit is set to '1' corresponding to the time where the last configuration data of the column is loaded into the respective latch bank.

Figure 3:
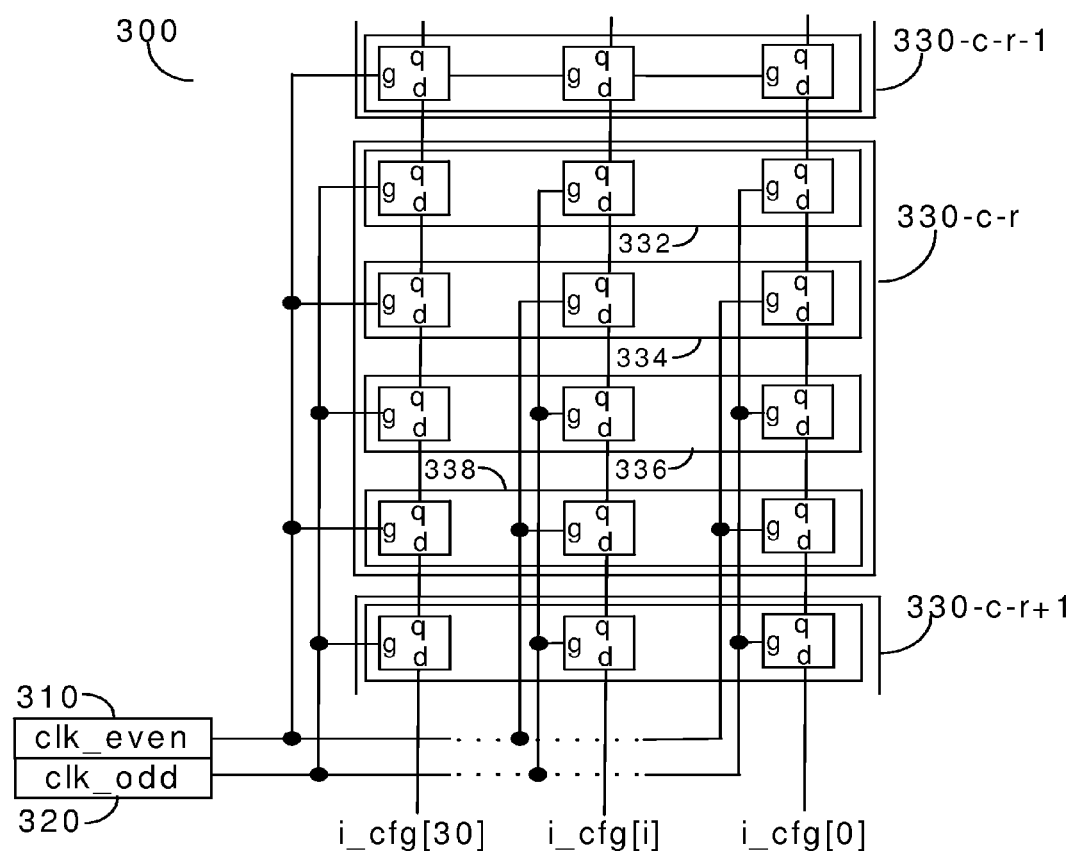
FIG. 3 is a block diagram of latches of the tiled FPGA clocked by two non-recovering clocks according to an embodiment.

In order to prevent the phenomenon of latch transparency (also known as a race condition) a scheme of two non-recovering clocks are used. FIG. 3 describes an exemplary and non-limiting diagram 300 of latches of the tiled FPGA clocked by two non-recovering clocks 310, 320 according to an embodiment. Non-recovering clocks are two or more clocks where there at no times there is more than one clock which is in its active state. Such clocks are also known as non-overlapping clocks. The clocks are designed such that data moves from one latch bank, comprising one of more latches, to an immediately subsequent latch, for example from the output of latch bank 334 into latch bank 332 responsive to clock signal clk_odd 320. Latch bank 334 gets updated with data responsive to clock signal clk_even 310. The clocks clk_even 310 and clk_odd 320 being non-recovering clocks ensure that data does not race through the plurality of latch banks of column 'c' impacted solely by the delay characteristics of the latches. It should be understood that the latch bank elements, for example latch bank element 330-c-r, contains configuration data for its respective configurable FPGA elements 114 of the respective tile, for example, the tile in column 'c' and row 'r'. Overall, the operation is such that the writing into the sequence of latch banks that is done by moving data in one direction (as shown upwards) in the column. It should be noted that though four latch banks are shown, any number of latch banks may be used with respect of each tile as long as a subsequent latch bank receives a different clock, e.g. clk_odd 320, if the immediately previous latch bank received the other clock, e.g., clk_even 310. When connecting tiles within a column of tiles, which also requires connecting of the last latch bank of a previous tile to the first latch bank of a current tile, the same requirement exists, i.e., if the latch bank of the pervious tile received one clock, for example, clk_even 310, then the first latch bank of the current tile must be connected to the other clock, for example, clk_odd 320, and vice versa. This will ensure proper operation within the column. Moreover, according to an embodiment, it is not necessary that each column has the same number of latch banks and it is possible that each column will hold a different number of latch banks, or for that matter, have the same number of latch banks, but distributed in any desired way between the tiles of the column, for as long as each tile has at least one such latch bank.

Figure 4:
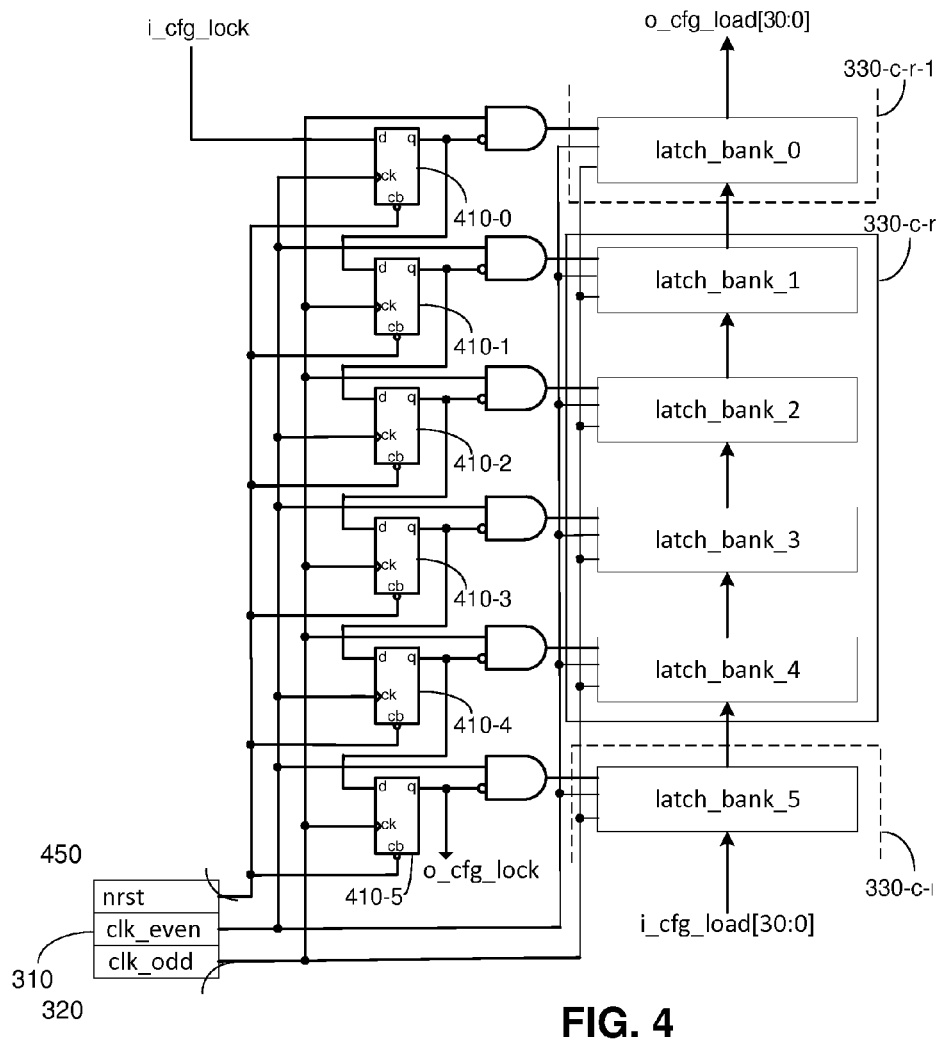
FIG. 4 is a block diagram of the locking mechanism of the tiled FPGA clocked by two non-recovering clocks according to an embodiment.

FIG. 4 depicts an exemplary and non-limiting block diagram 400 of the locking mechanism for a single column of tiles of the tiled FPGA clocked by two non-recovering clocks, clk_even 440 and clk_odd 430, according to an embodiment. In the exemplary case a column of six latch banks 420-0 through 420-5 is shown. In this exemplary case, latch_bank_0 is part of latch bank element 330-c-r-1, latch_bank_1 through latch_bank_4 are part of latch bank element 330-c-r, and latch_bank_5 is part of latch bank element 330-c-r+1, where each such latch bank element 330 used for the configuration of FPG elements 114 of a corresponding tile in a column. The latch banks are so connected that data from one latch bank is provided to the immediately following latch bank such that the content of each of the latches of one latch bank are transferred to the immediately preceding corresponding latches of the preceding latch bank using the clocking scheme of the non-recovering clocks. For each latch bank of latch_bank_0 through latch_bank_5 there is a corresponding DFF 410, for example DFF 410-0 for latch_bank_0. The DFFs 410 are used to transfer the lock bit corresponding to each latch bank, that enables or disables, as the case may be, the latching capability of data into a corresponding latch bank. While the configuration data is fed in one direction of the column, in the case shown data flows from, for example, latch_bank_1 to latch_bank_0, the lock bits move in an opposite direction, in the case shown from DFF 410-0 to DFF 410-1. This ensures proper locking of the data in the latch banks and avoids the need of word and row lines in the implementation, thereby saving on decoding circuitry. It should be further understood that the lock bits have to be reset (i.e., receive a value of '0') to initialize the circuit, using reset signal 450, as they have to begin at a known value that leaves the latch banks unlocked as a starting point.

Figure 5:
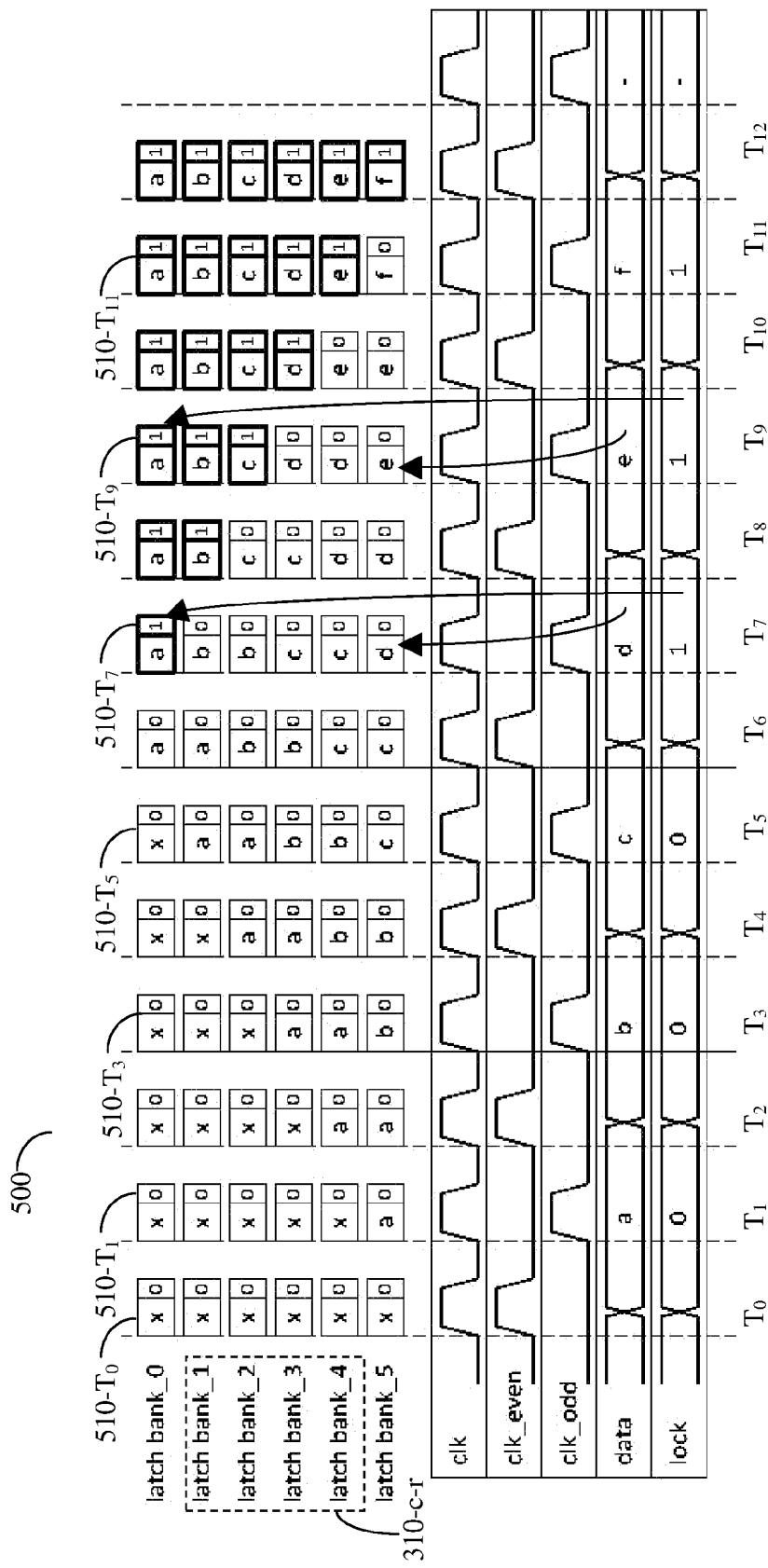
FIG. 5 is an illustrative timing diagram of the programming of the tiled FPGA clocked by two non-recovering clocks and having a configuration lock signal according to an embodiment.

Reference is now made to FIG. 5 where an exemplary and non-limiting illustrative timing diagram 500 depicting the programming of a portion of a column of a tiled FPGA clocked by two non-recovering clocks and having a configuration lock signal according to an embodiment. According to this example it is necessary to load the latch bank elements 310, having a latch element 310-c-r containing four latch banks latch_bank_1 through latch_bank_4, where latch_bank_4 receives configuration data from latch_bank_5 of a previous latch bank element, and where latch_bank_1 provides data to latch_bank_0 of an immediately subsequent latch bank element. In this way an even numbered latch bank overrides the content of the subsequent odd numbered latch bank and an odd numbered latch bank overrides the content of an even numbered latch bank. This process continues until such time that a latch bank is locked by setting its lock flip-flop to '1' thereby preventing any future override by content from a previous latch bank, and as further explained herein. The data loaded, in this example, is designated for simplicity by 'a', 'b' . . . 'f' respectively, which represents, for example, the 31 bits of data previously discussed. Hence the timing diagram 500 illustrates the content of a column of latch banks and lock bits at different points in time. The values shown as 'x' stand for either meaningful data that has not yet reached its designated latch bank or don't care values of latch banks that are going to be overwritten by valid data, as the case may be.

Accordingly at $T_0$ the value 'a' is provided at the input end of the configuration data with a '0' lock value at the lock bit input. At $T_1$, the value 'a' is latched into latch_bank_5. At $T_2$, the value at the data input changes to 'b', and the lock bit value provided is '0', while the value 'a' provided from latch_bank_5 is latched into latch_bank_4. In $T_3$ the value 'b' is latched into latch_bank_5 and the value 'a' is latched into latch_bank_3. This continues until at $T_6$ the data value is changed to 'd' and lock bit supplied is '1' as it is time to lock the latch_bank_0 with the value 'a', which subsequently happens at $T_7$. Thereafter, data from a previous latch bank, in this case data from latch_bank_1, does not get latched into the latch of latch_bank_0, as it is now locked. Eventually, all data gets locked at its respective latch bank. In the diagram 500, bold cells depicted cell having locked values therein. For further non-limiting illustration one may consider the lock bit providing a value '1' at $T_7$ to the column, i.e., position 510-$T_7$, where the lock bit of latch_bank_0 becomes '1', thereby locking configuration word(s) 'a' in that latch bank, while adding configuration word(s) 'e' into latch_bank_5. Similarly, at the lock bit providing a value '1' at $T_9$ to a subsequent column, i.e., position 510-$T_9$, where the lock bit of latch_bank_0 is also '1' being pushed down the column, thereby locking configuration word(s) 'c' in latch_bank_2, while maintaining the latch_bank_0 and latch_bank_1 locked with their respective data 'a' and 'b'. From the other side, i.e., at the bottom of the column, adding configuration word(s) 'e' into latch_bank_5. While moving configuration word(s) 'd' further up the column. Hence, the flow of the lock bit data down the lock bit column successively locks the correct configuration data in each respective latch bank. In order to function properly, the lock bit value has to be set to '1' in the sequence of configuration words when the configuration data for the top latch bank is reached, and thereafter remain set at '1' until the entire column of latch banks is properly locked.

In one embodiment a robust FLU embeds therein an error detection circuitry. The main objective of the addition of this error detection circuitry is to catch FLU configuration issues, e.g., configuration errors versus expected configuration of the FLU. This is used to increase FLU robustness by executing the checks continuously once the FLU exits its programming mode. Thereafter, various failures modes, including but not limited to silicon failures due to aging, are caught and signaled, allowing for timely correction, for example, and without limitation, by reentering programming mode of the FLU, of the FLU operation.

Figure 6:
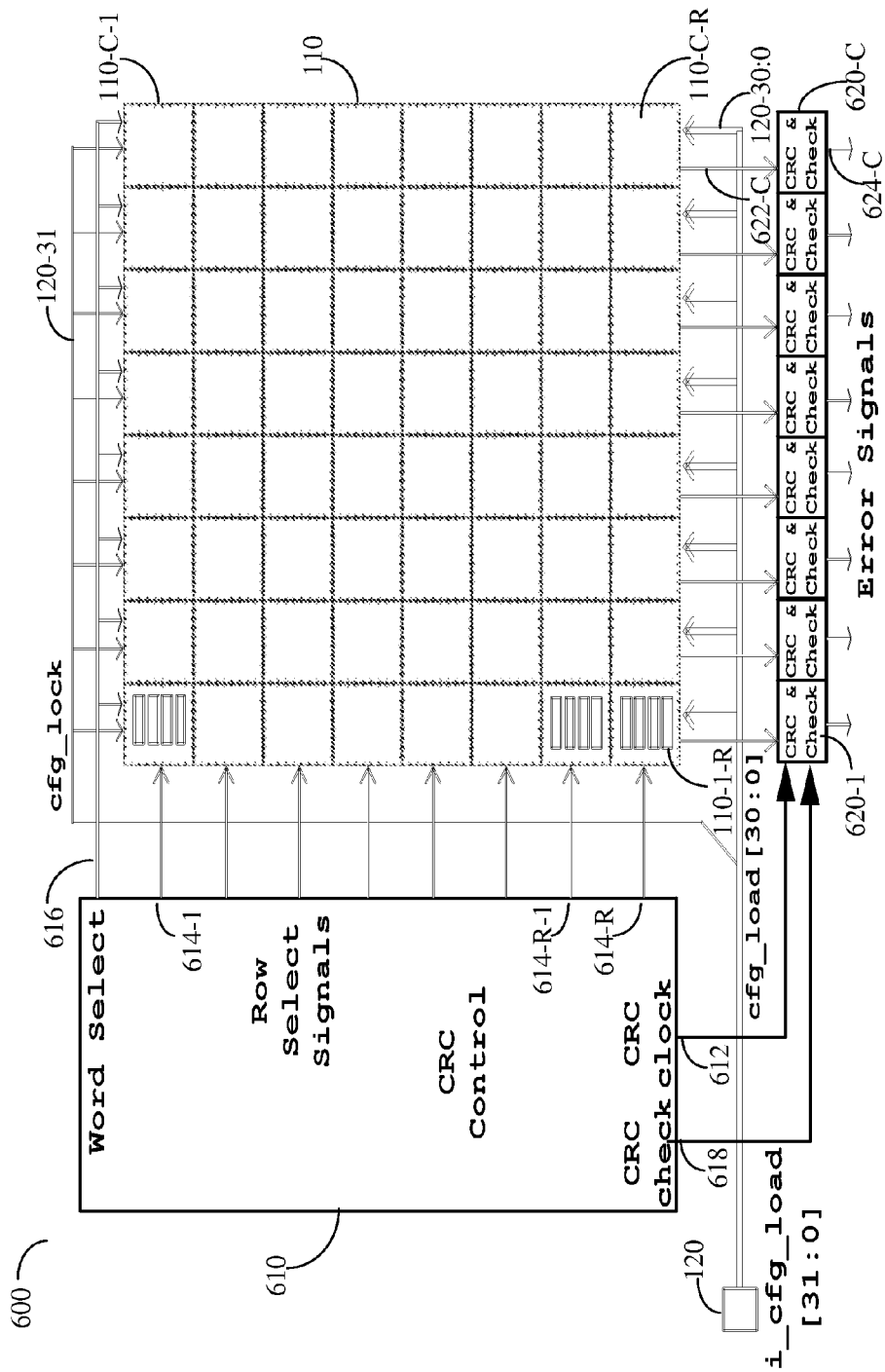
FIG. 6 is a block diagram of a tiled FPGA of a robust FLU configured with an error detection circuitry according to an embodiment.

FIG. 6 depicts an exemplary and non-limiting block diagram 600 of a tiled FPGA of a robust FLU configured with an error detection circuitry according to an embodiment. The basic structure of the matrix 110 has been described at least with respect of FIG. 1, as well as thereafter, and therefore is not repeated here. Circuitry has been added to the circuit described in FIG. 1 and this additional circuit is explained herein. Specifically, cyclic redundancy check (CRC) circuitry 620 is added to allow the checking of the configuration data loaded into the configuration latches, also referred to herein as configuration words. One of ordinary skill in the art would readily appreciate the loading incorrect data in a configuration words, or, having a configuration word change spontaneously one or more of its configuration bits, can result in unpredictable operation of the tiled FPGA and hence should be avoided or otherwise be repairable. Therefore, a detection mechanism is added and a check is performed to ensure the configuration data is correct. According to an embodiment of the invention this is done while the FLU is in operation mode, i.e., after completion of its programming and exiting programming mode, and until exiting the operation mode and reentering the programming mode. To allow for such checking, a CRC control 610 is added to the tiled FPGA and is operative throughout when the FLU is in the operation mode, during which it provides a series of signals that control the detection operation of the FLU, and as further explained herein. The checking process cannot be activated when the FLU is in a programming state. Once programming is done, the CRC is executed in loop as soon as the FLU configuration is loaded and while the device is powered on. In addition, CRC and Check circuits 620, in one embodiment one per column of the matrix 110, are also added to the tiled FPGA. Within each tile 110-c-r, where 'c' and 'r' are integers starting with '1' and reaching C and R final integer values respectively, for example tile 110-1-R, a path from each of the configuration latches therein connects to a column data bus 622. For example, column 1 connects to data bus 622-1 while column C connects to data bus 622-C. Each of the data busses 622 connects to a corresponding CRC and Check circuit 620-1 through 620-C.

To control the operation of the CRC, the CRC control 610 generates a CRC clock 612 to the CRC and Check circuits 620. The CRC clock 612 causes the computation of a new CRC on, for example, each post-edge of the CRC clock 612. In addition it provides row select signals 614, enabling one row of tiles at a time, from row select signals 614-1 through row select signals 614-R. It should be noted that for the purpose of accessing a plurality of configuration words in a particular tile, the word select signals 616 allow the access to each and every configuration latch within a particular tile selected by the respective row signal 614. The CRC and Check circuit 620-c allows calculating CRC in parallel on each configuration latch of all columns. Hence it is therefore possible to select a particular configuration latch by row and cause that content therein to be provided to the corresponding column data bus 622. For example, when a row select signal 614-1 is activated than a configuration latch of tile 110-C-1, corresponding to the appropriate word select 616 signal will be provided to the CRC and Check circuit 620-C. By serially moving from one configuration latch to the other, the content of each of the configuration latches is provided to its respective CRC and Check circuit 620 and a CRC can be performed respective of the data provided.

Once the entire CRC of columns is completed, a check is done by comparison with the expected CRC loaded during configuration into the CRC and Check circuits 620 on a per column basis; it is then possible to check error signals 624, one error signal 624 per column, provided from each of the CRC and Check circuits 620, each error signal having a first state indicating that no error has been detected and a second state indicating that an error has been detected. If an error signal 624, for example 624-C, indicates an error state then that particular column has to be reconfigured in a manner described in more details herein. The CRC check signal 618 is activated upon the completion of the CRC computation, i.e., once all the tiles 110-c-r have been checked, to cause the comparison between the expected CRC and the computed CRC. One or more error signals 624 may be then generated to signal if an error has occurred. The control is operative such that columns of tiles are operated on in parallel, having separate word selections for the words in each tile of each column.

Figure 8:
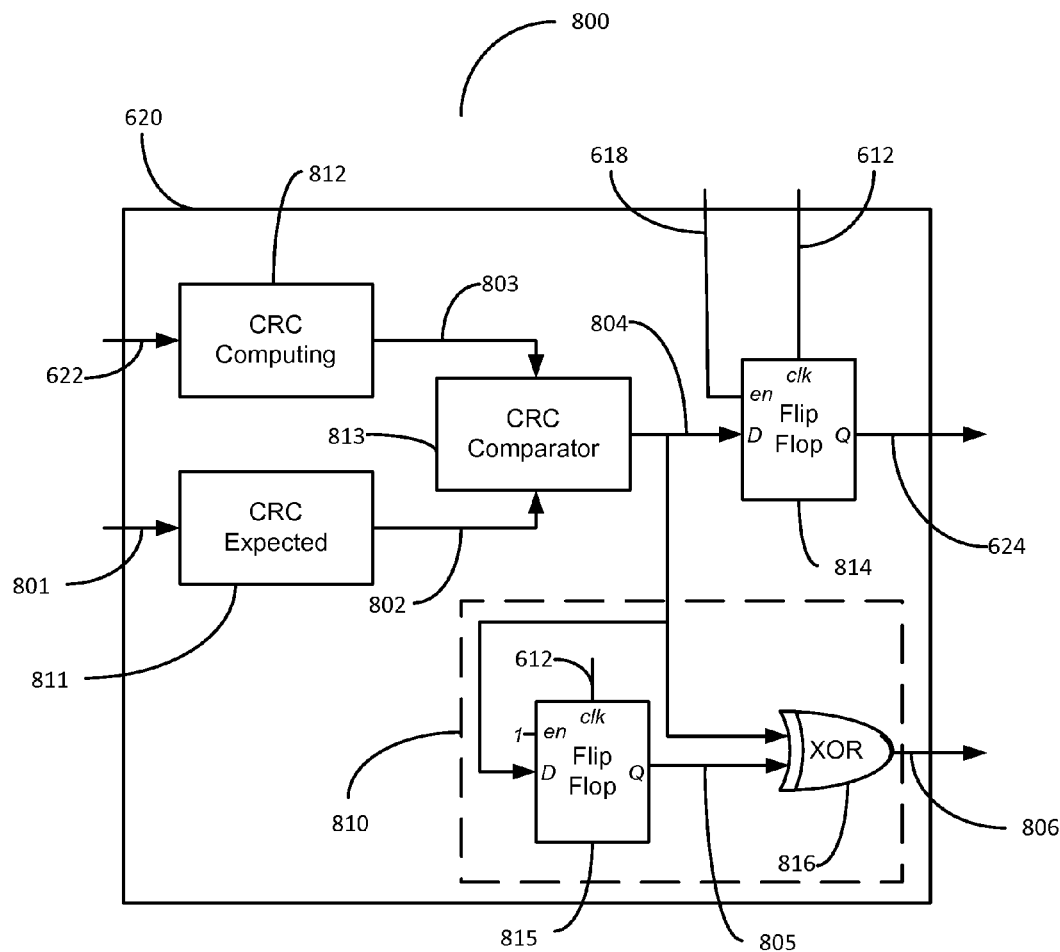
FIG. 8 is block diagram of the CRC check circuit associated with each column of the tiled FPGA shown in FIG. 6.
Figure 9:
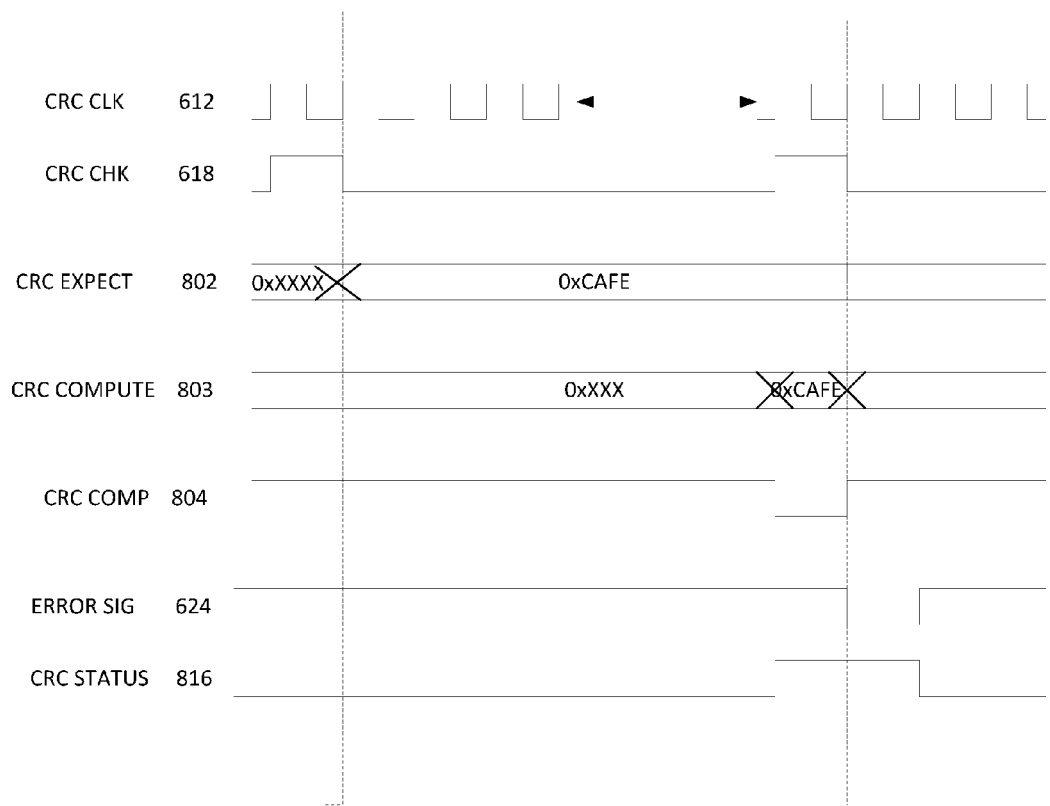
FIG. 9 is a typical timing diagram of the CRC checker shown in FIG. 8.

FIG. 8 depicts an exemplary and non-limiting block diagram 800 of the CRC and Check circuit 620 associated with each column shown in FIG. 6, and FIG. 9 is a typical timing diagram of the CRC checker 620. The row select signal 614 activates each row as described earlier and the word select signal 611 enables each of the configuration latches of the selected tiles to be cycled through to enable checking of the complete FLU configuration as described previously. The register 811 is an expected value register in the CRC checker 260. During configuration the expected CRC value of for each column 110-1 to 110-C is loaded into the appropriate expected value registers 811-1 to 811-C of CRC and Check circuits 620-1 to 620-C respectively. The stored expected value 801 is used as a check to compare against the generated CRC value 803 from a CRC computation block 812 of FIG. 8. The CRC computation block 812 computes the CRC value 803 based on the CRC data input received on the data bus 622 and at each CRC clock 612 edge. The CRC value is computed for all the row of tiles 110-c-1 to 110-c-R in each column. The CRC checker 260 hence calculates the CRC value of the column of tiles 110-c-1 to 110-c-R for all columns of tiles 110-1 to 110-C. The computed CRC value 803 is fed to a CRC comparator 813, that compares the computed CRC value 803 with the expected value 802 input, to produce an output that is an indication of the correct or error value 804. This output is fed to a first D Flip-Flop 814 clocked by the CRC clock and having an enable that is the CRC check input 618. At the end of each column check a CRC check input enable the D-FF to output an error signal 624 that indicates to the correctness of the configuration of the column as described earlier. An additional implementation of the CRC checker 260 provides for a monitoring of the activity of the error detection circuitry by using the circuit in the block 810. The CRC clock is used as clock to drive a second D-FF 815. The enable 'en' of the D-FF is set to 1 and the D input is the output 804 of the CRC comparator 813. The output 805 of the D-FF 815 is fed to a first input of an XOR 816. The CRC comparator output 804 is fed to the second input of the XOR 816. The output 804 of the CRC comparator 813 is clocked out of the D-FF 815 and applied to the second input of the XOR 816 so that it provides result of the previous CRC check. The XOR 816 compares continuously the results of the previous and current CRC checks to make sure that the generated CRC value 803 and the output 804 of the CRC comparator 813 change during the checking process.

Figure 7:
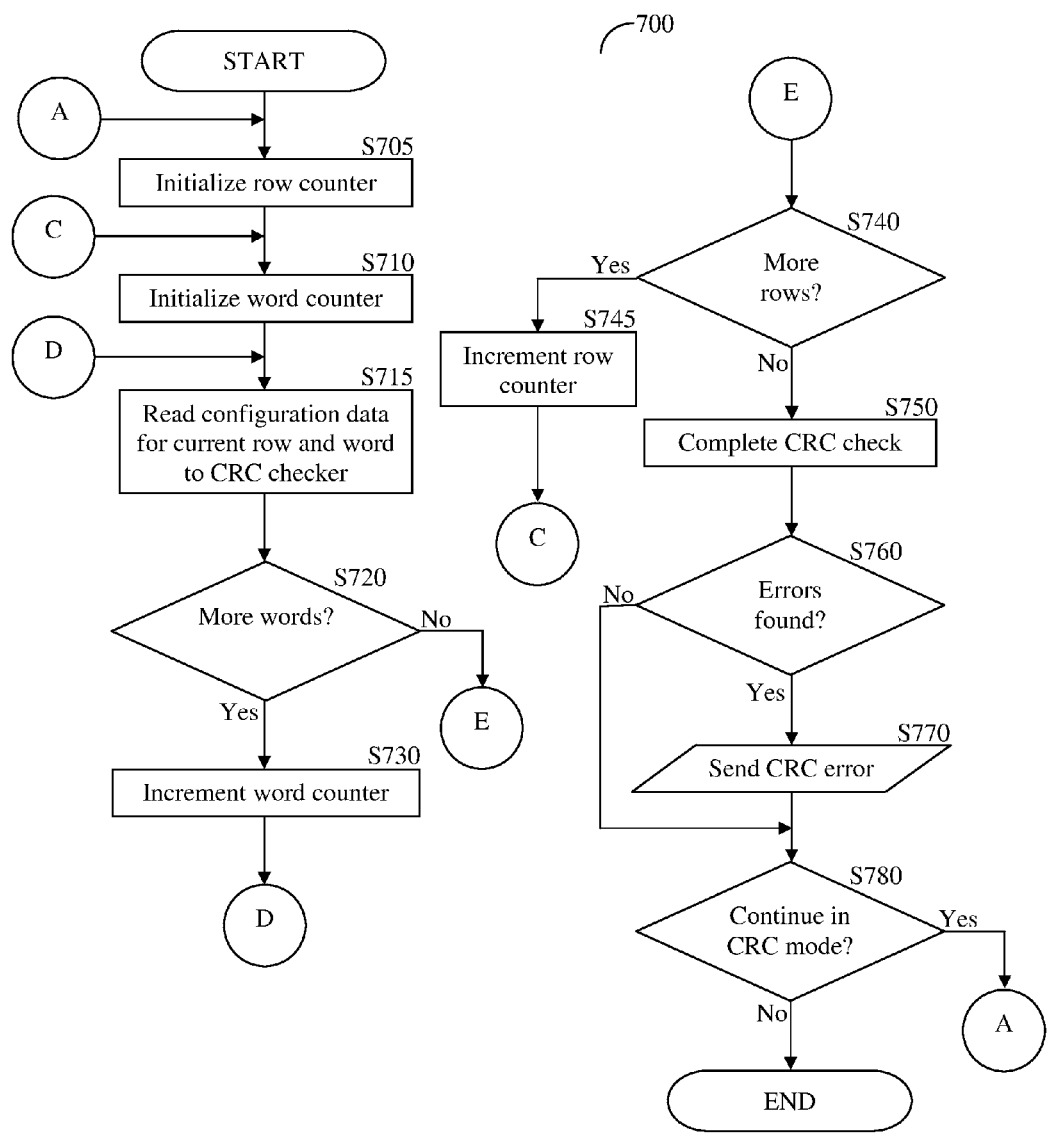
FIG. 7 is a flowchart describing the checking process of a column of tiles of a tiled FPGA of a robust FLU configured with an error detection/correction circuitry according to an embodiment.

FIG. 7 describes an exemplary and non-limiting flowchart 700 describing the checking process of a column of tiles of a tiled FPGA of a robust FLU 600 configured with an error detection/correction circuitry according to an embodiment. The same operation takes place in parallel for each and every column of tiles of the FLU. In S705 a row counter (not shown) implemented as part of the CRC control 610, is initialized. In S710 a word counter (not shown) implemented as part of the CRC control 610, is initialized. In S715 the configuration data is read from a configuration latch corresponding in position to the current row and word counters' values. In S720 it is checked whether additional words are to be checked and if so, execution continues with S730; otherwise, execution continues with S740. In S730 the word counter is incremented and execution continues with S715. In S740 it is checked whether more rows are to be read and if so execution continues with S745 where the row counter is incremented, and thereafter, execution continues with S710; otherwise, execution continues with S750. In S750 the CRC is completed and comparison is done between the CRC calculated and the CRC expected. In S760 it is checked whether if at least an error is detected and if so execution continues with S770; otherwise, execution continues with S780. These error signals provide an indication that an error has occurred and preferably provide an indication in which of the words such an error happened. In S770 a CRC error signal is initiated. Such a generation of an error signal may separately initiate a sequence that results in the FLU going out of the operation mode and entering the programming mode of the FLU, to allow for full or partial reprogramming as the case may be. In S780 it is checked whether to continue the checking and if so execution continues with S705; otherwise, execution terminates. The method may make such a determination to terminate, for example, in response of the FLU entering the programming mode of the FLU. One of ordinary skill in the art would readily realize that the embodiment described in FIG. 7 is merely one possible way of implementing the check and others are possible without departing from the scope of the invention, including, for example, running one process to perform the check and another state machine or process to cause entry and exit from one mode, for example operation mode, to another mode, for example, programming mode.

In the above description of FIG. 7, it was stated that the error signals provide an indication that an error has occurred and preferably provide an indication in which of the words such an error happened. The latter can be achieved in another embodiment by calculating the CRC as each word is received at the CRC and Check circuits 620 and comparing them to a respective expected CRC for that word. In particular, CRC data can be added to each configuration word to allow the check of each individual configuration word by the CRC and Check Circuits 620. Thus the error may be immediately detected for any word in error, in which case the CRC check may be stopped and the reloading of the column immediately started, or the reloading only started after all configuration words in that column have been processed. If the processing of the entire column of configuration words is completed before reloading is started, each configuration word in error may be noted, so that if at least one error continues to occur, one can separate hard error (repeatable as in a hardware fault or bad configuration words to start with), or soft errors (non-repeatable, as may be caused by noise or some other problem).

One of the problems faced when using EFPGAs to handle security and similar critical features of the design is that when an error is identified by the CRC check, the whole EFPGA has to be taken out of the circuit and fully or partially reconfigured and reprogrammed to start from a known reference point. This means that the critical feature is shutdown and remains off till the EFPGA comes back on line. In some of these critical cases this can take as much as 100,000 clock cycles or a few milliseconds which in some applications become unacceptable. In some of these cases where the EFPGA functionality is used for a larger function that includes some critical elements, it is possible to separate out a critical functions and non-critical functions within the designed functionality implemented. By implementing a second block of the EFPGA that can function independently as a redundant unit with only the critical functions, it is possible to ensure that the critical function implemented does not fail even when a fault is identified by the CRC of the FLU robust mechanism, which requires a full reset or at least a partial re-programming of the EFPGA. What is proposed in the invention is implementing the capability within the EFPGA to have two or more independently operating sections, each with its own user clock and reset, such that the redundancy can be implemented and a change over from the full functionality to the critical functionality section can be done on the fly, when a fault is identified on the full functionality EFPGA section. By providing the capability for the arrayed EFPGA to split into multiple sections that can operate independently the current invention makes such applications feasible. The number of sections itself is limited by the EFPGA block size and the interconnection capability within the EFPGA to implement the needed functionality.

The invention hence allow the EFPGA (FLU) to be reconfigured into multiple FLU sections each operating independent of the other, each with its own user clock and reset capability. The splits can be configured to provide FLUs of differing sizes as required. This allows the instantiation of critical program elements in redundant blocks to prevent complete shut down of critical functions of the EFPGA even when an error is identified on a section of the EFPGA requiring it to be taken out of the system and re configured.

The main objectives of the current invention is to allow mapping of two or more applications into independent sections of a single EFPGA (FLU), that are isolated from each other and can work independently, each with its own user clock and reset. The sections can be defined using a configurable split column select, which allows the sections to have flexible sizing as needed to implement the functionality.

Figure 10:
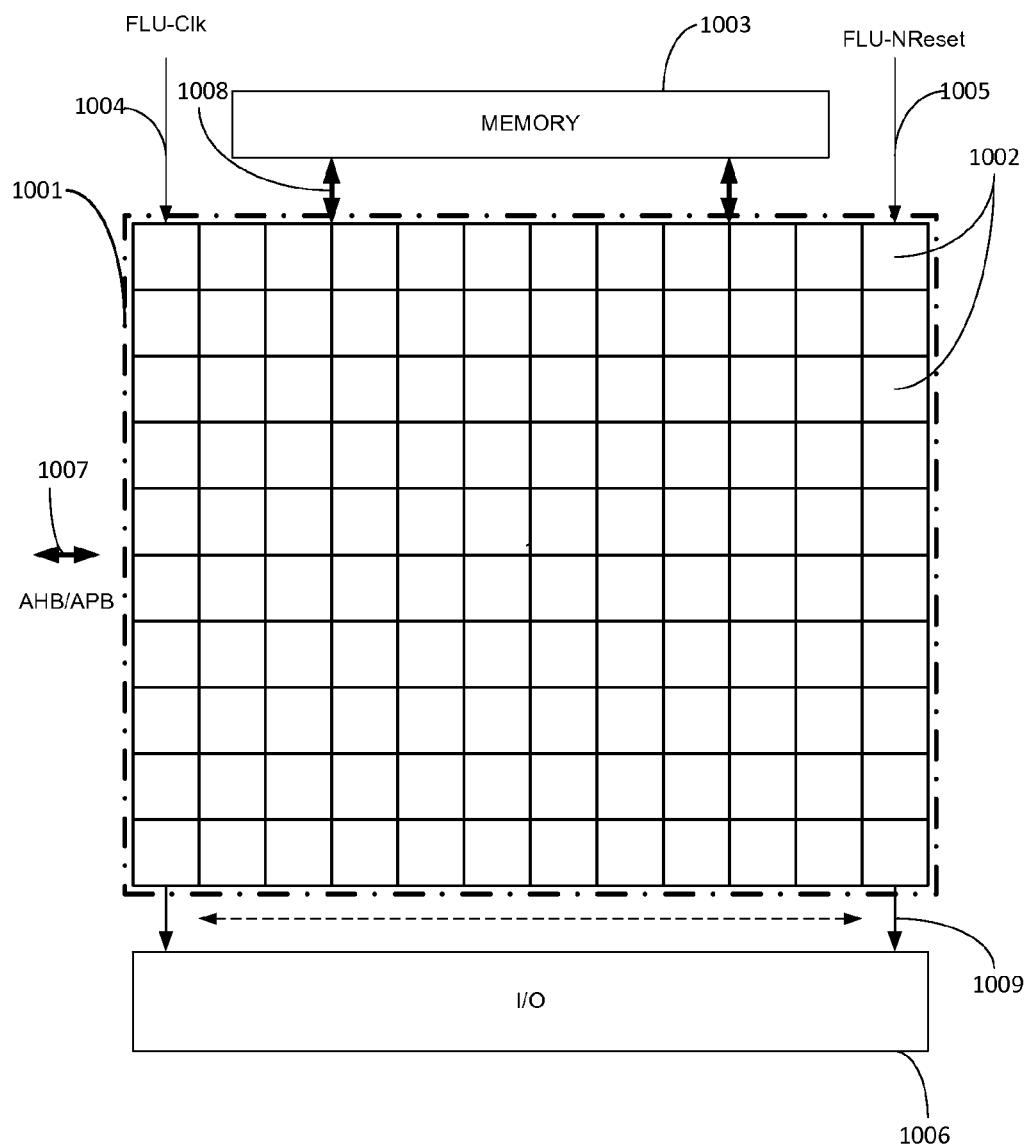
FIG. 10 is a block diagram for an exemplary implementation of a single EFPGA (FLU).

FIG. 10 shows a single block EFPGA (FLU) 1001 implemented. It comprises a set of vertical and horizontal arrays of logic blocks 1002 with interconnect and programmability to be configured. Each logic block 1002 contains programmable logic and DFFs to perform user function. These user DFFs have a user clock and reset associated. The FPGA may be connected to a memory block 1003 by high speed links 1008 and an IO block 1006 connected to the array by I/O connections 1009 as shown. The processor and other external connections are using APB/AHB 1007 (Advanced Peripheral Bus/Advanced High Performance Bus). An FPGA user clock input 1004 and a FPGA user reset 1005 are also provided to clock and reset the functional user DFF (in opposition of configuration DFF/Latch) in the matrix.

Figure 11:
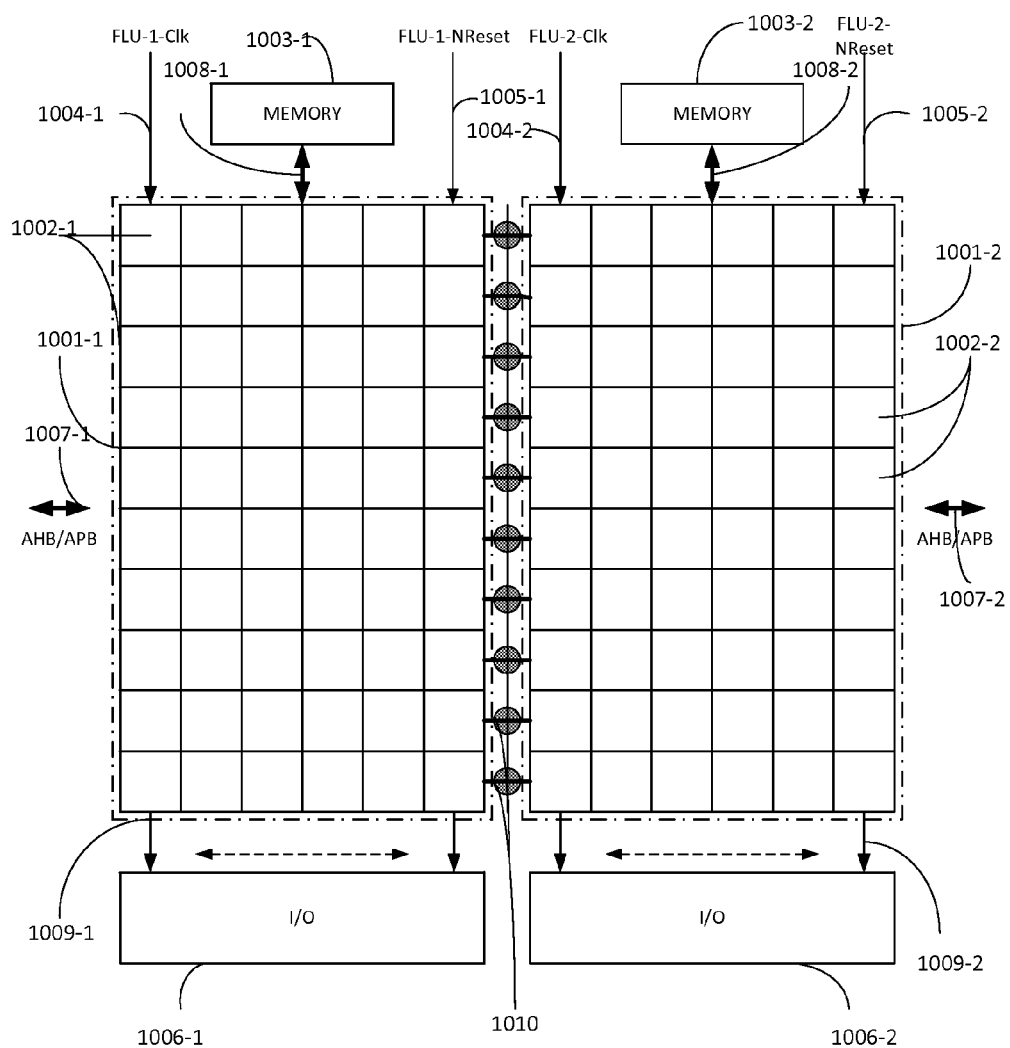
FIG. 11 is a block diagram for the splitting of the single FLU into multiple FLU sections.

FIG. 11 shows the splitting of the single FLU 1001 into multiple FLU sections 1001-1 and 1001-2 each having a predefined set of columns as decided by the configurable split signal 1010. This split signal 1010 defines the column number where the split happens by using the binary column address and is configurable to allow the split at any column of the FLU 1001. The split creates two independently operating sections of the EFPGA (FLU) for implementing and providing redundancy to critical functions during reconfiguration of an EFPGA (FLU) 1001-1 and 1001-2 sections.

Figure 12:
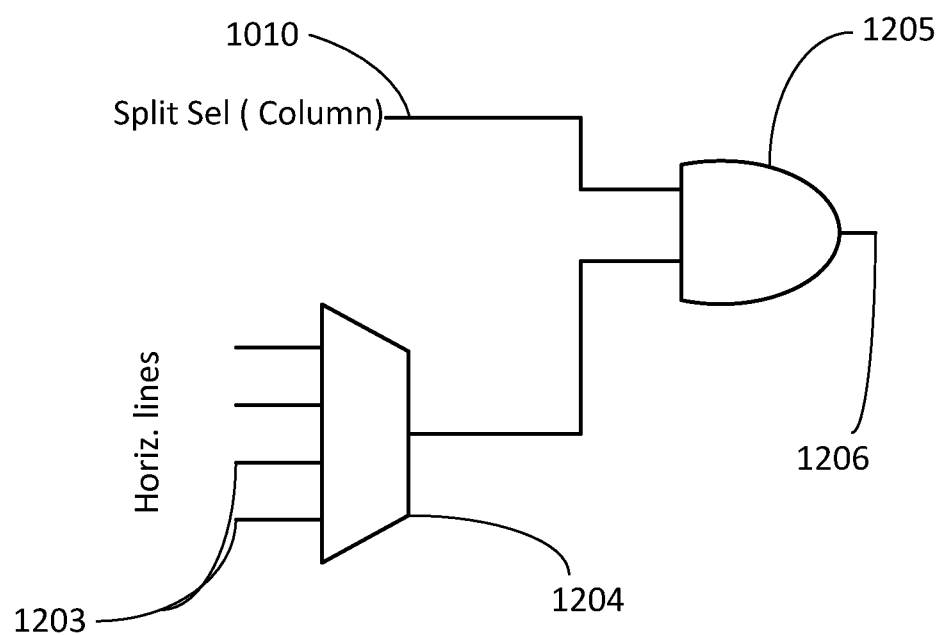
FIG. 12 is a block diagram for a circuit that enables horizontal connections between adjacent blocks within the FLU.

Since the two sections of the FLU 1001-1 and 1001-2 are independently operating it is necessary to stop any horizontal interconnections at the split boundary. This function is shown in FIG. 12 is done using the split select signal 1010 and doing an AND gate 1205 which enable horizontal connections 1204 between adjacent blocks within the FLU 1001. This circuit hence prevents any horizontal connectivity between the horizontal lines 11203 of the FLU 1001-1 to the FLU 1001-2 once the split is enabled there by isolating the two FLU sections for independent operation.

Figure 13:
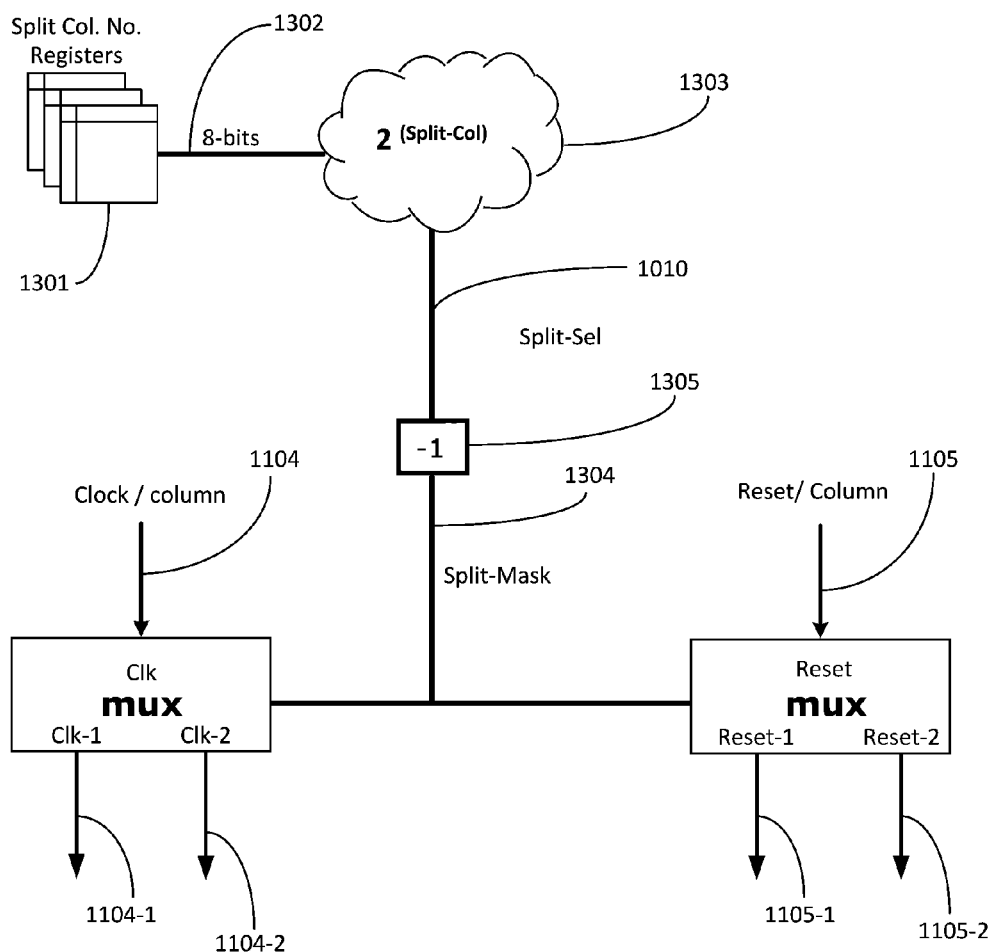
FIG. 13 is a block diagram for a circuit that separates the clock and Reset for each block and provides independent inputs to each of the FLU sections after the split.

Another requirement for independent operation is separating the user clock and reset for each block and providing independent inputs to each of the FLU sections 1001-1 and 1001-2 after the split. This is again handled as shown in FIG. 13. The split sell 1010 is generated from the 8 bit split column defined by the register 1301 and the address col is generated 1303. An adder unit is used to subtract a value of '1' from the address to generate a split mask 1304. The generated split mask is used to drive the two sets of column based FLU user clocks 1004-1 and 1004-2 for the two sections of the FPGA, independently, from the input user clock. Similarly the split mask is used to drive the two sets of column based user resets 1005-1 and 1005-2 for the two sections of the EFPGA from the user reset block. This helps to make the two sections of the FLU (EFPGA) completely independent of each other.

As an example of the split mask application: if a 5 column EFPGA(FLU) is to be split in such a way as to have two column and a 3 column sections, then the split select will be $2^2$=00100 and the split mask will be 00100-1-00011 in binary. This means that the columns 0 and 1 will use user clock 1 and the columns 3, 4 and 5 will use user clock 2.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure. Specifically, in one embodiment the disclosed FLU/FPGA may be implemented as a stand-alone integrated circuit (IC) containing one or more FLUs. In another embodiment the IC may contain one or more FLUs as well as other circuitry may it be analog, digital or any combination thereto. Further the EFPGA or the IC may contain split FLUs each handling a separate functionality or redundant functions for reliability improvement.

Other applications and uses of the capabilities of the FLU as implemented may be known or may become known to the practitioners of the art and this invention as described is intended to cover those as they become known.

What is claimed is:

1. A flexible logic unit comprising:
    a matrix having a plurality of tiles arranged in a plurality of columns, each of the plurality of tiles having one or more user D-type flip flops therein;
    a first user clock generator;
    a second user clock generator;
    a split mask register that provides a plurality control lines to identify which of the plurality of columns belong to a first section and which of the plurality of columns belong to a second section; and
    a plurality of user clock selectors, each of the plurality of user clock selectors coupled to the split mask register, to the first user clock generator, to the second user clock generator, and the plurality of user D-type flip flops in one of the plurality of columns, each of the plurality of user clock selectors selectively providing a user clock signal from one of the first user clock generator or the second user clock generator to the plurality of user D-type flip flops in one of the plurality of columns according to the split mask register.

2. The flexible logic unit of claim 1 wherein each of the plurality of user clock selectors includes a multiplexer that receives the first user clock generator and the second user clock generator as multiplexer inputs and provides the user clock signal as a multiplexer output.

3. The flexible logic unit of claim 1 further comprising:
    a first user reset generator;
    a second user reset generator;
    a plurality of user reset selectors, each of the plurality of user reset selectors coupled to the split mask register, to the first user reset generator, to the second user reset generator, and the plurality of user D-type flip flops in one of the plurality of columns, each of the plurality of reset selectors selectively providing a user reset signal from one of the first user reset generator or the second user reset generator to the plurality of user D-type flip flops in one of the plurality of columns according to the split mask register.

4. The flexible logic unit of claim 3 wherein each of the plurality of user reset selectors includes a multiplexer that receives the first user reset generator and the second user reset generator as multiplexer inputs and provides the user reset signal as a multiplexer output.

5. The flexible logic unit of claim 1 wherein the split mask register receives column number signals that are a binary representation of a column number at which the matrix is split, the split mask register generating the plurality control lines such that one of the plurality control lines is coupled to a corresponding one of the plurality of user clock selectors corresponding to one of the plurality of columns.

6. The flexible logic unit of claim 5 wherein the split mask register generates the plurality control lines such that they are a binary representation of two raised to the power of the column number at which the matrix is split and then decremented by one.

7. A flexible logic unit comprising:
    a first clock and a second clock, the first clock and the second clock being non-recovering clocks;
    a matrix having a plurality of tiles arranged in columns and rows, each tile having at least one latch bank therein, each latch bank within any one column having an identical number of one or more latches therein, each tile having configurable logic configurable responsive to configuration data stored in the respective latch bank, the latches in each latch bank being clocked in unison for that latch bank, each of the latch banks being arranged to accept configuration data from an immediately previous latch bank in that column, such that one latch bank is clocked by the first clock if an immediately previous latch bank in the same column is clocked by the second clock or by the second clock if an immediately previous latch bank in the same column is clocked by the first clock, each column of the matrix being configured to accept configuration data in a first configuration data flow direction within the column;
    a plurality of lock flip-flops arranged in columns, each lock flip-flop corresponding to a respective latch bank of a respective column of the matrix, the plurality of lock flip-flops configured to accept a lock bit in a lock bit flow direction that is opposite to the configuration data flow direction, one lock flip-flop being clocked by the first clock if an immediately previous lock flip-flop in the same column is clocked by the second clock or by the second clock if an immediately previous lock flip-flop in the same column is clocked by the first clock;
    a control interface to accept at least a configuration word for each latch bank and associated lock flip-flop, the interface configured to separate, for each column, configuration data and lock bits data from the configuration words;
    a plurality of data busses, one for each column of the matrix configured to receive data from each of the one or more latches in each of the latch banks of each column;
    a cyclic redundancy check control circuit providing a CRC clock, a CRC check signal, and a plurality of row select signals and a plurality of word select signals for selection of a particular latch bank in a particular row and enabling the loading of configuration data stored therein onto a corresponding data bus of the plurality of data busses, the cyclic redundancy check control circuit configured to begin operating when the flexible logic unit completes data configuration; and a plurality of cyclic redundancy check circuits, each corresponding to one of the plurality of data busses, each cyclic redundancy check circuit including an expected value register that is loaded with an expected CRC value for the corresponding data bus when the flexible logic unit completes data configuration, a CRC computation block that computes a computed CRC value based on the configuration data input received on the data bus in each CRC clock cycle, a CRC comparator that compares the computed CRC value with the expected CRC value to produce a CRC comparison result, and a register to hold the CRC comparison result when the CRC check signal indicates that the computed CRC value should match the expected CRC value.

8. The flexible logic unit of claim 7, wherein the cyclic redundancy check control circuit is further configured to continuously perform a cyclic redundancy check for as long as the flexible logic does not reenter data configuration.

9. The flexible logic unit of claim 7, wherein the cyclic redundancy check is performed on all columns of the matrix in parallel.

10. The flexible logic unit of claim 7, wherein responsive to an error indication on the at least an error signal the flexible logic unit returns to a programming mode.

11. The flexible logic unit of claim 7, wherein the configurable logic comprises at least one field programmable gate array coupled to the plurality of latch banks to be configured by configuration data therein.

12. An integrated circuit comprising a plurality of electronic circuits where at least one of the electronic circuits is the flexible logic unit of claim 7.

13. The flexible logic unit of claim 7, wherein the lock flip-flops are reset to initialize the flexible logic unit.

14. The flexible logic unit of claim 7, wherein the cyclic redundancy check data is associated with each column of the matrix, and each cyclic redundancy check circuit includes a storage capability for storage of the cyclic redundancy check data for the respective column of the matrix.

15. The flexible logic unit of claim 7, wherein the cyclic redundancy check data is associated with each configuration word, and each cyclic redundancy check circuit is configured to perform a cyclic redundancy check on each configuration word for each respective column of the matrix.

16. The flexible logic unit of claim 7, further comprising a plurality of CRC monitor circuits, each of the plurality of CRC monitor circuits coupled to the CRC comparison result and the CRC clock signal of one of the plurality of cyclic redundancy check circuits, each of the plurality of CRC monitor circuits comparing the CRC comparison in two successive cycles of the CRC clock signal to generate a CRC monitor output.

17. A flexible logic unit comprising:

a matrix having a plurality of latch banks arranged in a plurality of columns, each latch bank within a particular column having an identical number of one or more latches therein that store configuration data;

a plurality of data busses, each of the plurality of data busses coupled to one of the plurality of columns to receive configuration data from the latch banks;

a cyclic redundancy check control circuit providing a plurality of select signals that select a particular latch bank in each of the plurality of columns and load configuration data stored therein onto a corresponding data bus of the plurality of data busses, a CRC clock signal that indicates when configuration data is loaded onto the data bus, and a CRC check signal that indicates that all of the configuration data in each of the plurality of columns has been loaded onto the plurality of data busses, the cyclic redundancy check control circuit configured to begin operating when the flexible logic unit completes data configuration; and a plurality of cyclic redundancy check circuits, each of the plurality of cyclic redundancy check circuits coupled to one of the plurality of data busses, the CRC clock signal, and the CRC check signal, each of the plurality of cyclic redundancy check circuits having an expected value register that is loaded with an expected CRC value for the corresponding column, each of the plurality of cyclic redundancy check circuits computing a CRC value based on the configuration data on the data bus, comparing the CRC value to the expected CRC value to produce a CRC comparison result, and holding the CRC comparison result when the CRC check signal is received; and a plurality of CRC monitor circuits, each of the plurality of CRC monitor circuits coupled to the CRC comparison result and the CRC clock signal of one of the plurality of cyclic redundancy check circuits, each of the plurality of CRC monitor circuits comparing the CRC comparison in two successive cycles of the CRC clock signal to generate a CRC monitor output.

18. The flexible logic unit of claim 17, wherein each of the plurality of CRC monitor circuits includes a D flip-flop coupled to the CRC clock signal and to the CRC comparison result, the D flip-flop providing a copy of the CRC comparison result that is delayed into a succeeding cycle of the CRC clock signal.

19. The flexible logic unit of claim 18, wherein each of the plurality of CRC monitor circuits includes an exclusive-or gate coupled to the CRC comparison result and to the copy of the CRC comparison result, the exclusive-or gate providing the CRC monitor output.

* * * * *